United States Patent [19]
Hong

[11] Patent Number: 5,468,324
[45] Date of Patent: Nov. 21, 1995

[54] SPIN-ON AND PEEL POLYMER FILM METHOD OF DATA RECORDING DUPLICATION AND MICRO-STRUCTURE FABRICATION

[76] Inventor: Gilbert H. Hong, 12820 Alta Tierra, Los Altos Hills, Calif. 94022

[21] Appl. No.: 207,878

[22] Filed: Mar. 8, 1994

[51] Int. Cl.⁶ .............. B29C 41/00; B32B 31/00
[52] U.S. Cl. .............. 156/247; 264/2.1; 427/240; 369/284
[58] Field of Search .............. 156/247, 242; 264/2.1, 2.2, 310; 430/5; 427/162, 240; 369/284

[56] References Cited

U.S. PATENT DOCUMENTS

| | | | |
|---|---|---|---|
| 4,759,990 | 7/1988 | Yen | 264/310 X |
| 4,812,279 | 3/1989 | Nakagawa et al. | 264/2.1 X |
| 5,075,147 | 12/1991 | Usami et al. | 369/272 X |
| 5,362,591 | 11/1994 | Imai et al. | 430/323 X |

OTHER PUBLICATIONS

Steven Brown, "The decade of the CD", San Jose Mercury News, p. 8, Jan. 9, 1994.
Y. Okino, et al., "Developments in fabrication of optical disks", Optical Disk Technology, pp. 236–241, 1982.
S. Horigome, "Novel stamper process for optical disc", Optical Storage Technology, pp. 121–128, 1988.

*Primary Examiner*—James Engel
*Attorney, Agent, or Firm*—Thomas E. Schatzel

[57] ABSTRACT

An embodiment of the present invention is a process in which a polymer solution is spin coated onto a master data recording disk, such as glass substrate with photoresist images, before separating. After drying and forming polymer, a polymer membrane results which is a faithful reproduction of micron-sized optical recording features on the surface of the master. Such membrane is either peeled-off and mounted to a pellicle-like frame or first laminated to a stiffer, stronger substrate before peeling to support the duplicate.

10 Claims, 2 Drawing Sheets

SPIN-ON AND PEEL POLYMER FILM METHOD OF DATA RECORDING DUPLICATION AND MICRO-STRUCTURE FABRICATION

BACKGROUND OF THE INVENTION

1. Field of the Invention

The present invention relates to optical discs and more particularly to methods and apparatus for duplicating data recordings, such as compact discs, as are used for computer, audio and video recording.

The present invention also relates to the fabrication of micro-structures in general, and in particular to the mass production of micro-miniaturized devices for such diverse fields as biomedical and micro-machinery.

2. Description of the Prior Art

Compact disc read only memory (CD-ROM) discs and drives are now ubiquitous in computer data storage, audio recording of musical artists and video. Given the universal demand for CD-ROM titles, the manufacturing of CD-ROM duplicates from masters have assumed very large volumes.

CD-ROM manufacturing is concerned both with duplication fidelity and manufacturing cost. The manufacturing processes used in CD-ROM production closely resemble those used in the fabrication of semiconductors, especially the methods used in mask making.

Mastering, as its name implies, is the process of creating the disc from which all others are produced. The first step in the manufacturing process is to create a master that can be used for replication. A laser can be used to burn pits and lands containing the data into a photoresist surface beginning at the center track and moving outward in a spiral pattern.

After checking a glass master for accuracy, conventional replication machinery makes a stamper. Different replication processes require slightly different stampers, but the function remains the same, embossing the data pattern on the mass-production disc. Through an injection molding process, a series of intermediate impressions are made that provide a generation of negative stampers that produce positive disc images. The family-tree-like structure of this part of the production cycle has given rise to names such as mother father and sons or daughters for the various disc generations.

Compact discs (CDs) are typically made from a polycarbonate plastic, which is a material that is less vulnerable to water absorption and heat than polymethylmethacrylate (PMMA) which is universally used in laminated videodiscs. Videodiscs comprise two slices of substrate sandwiched together, so they are more rigid than CDs. Manufacturers take precautions to prevent heat or water-absorption warping, e.g., by using some type of injection molding in which polycarbonate resin is heated and poured into molds that shape the discs. A stamper impresses data patterns into the cooling plastic, and the disc is then put in a vacuum chamber, where a reflective layer of aluminum is added and coated with a protective lacquer. Labels are silk-screened or printed on the lacquer side.

Injection molding has a number of advantages. Plants worldwide use the technique, and its idiosyncrasies are well known. Yields are typically low when a manufacturing plant first opens, and increase substantially as experience is gained. Injection molding's critics claim the process is messy and requires large capital investments in equipment and clean rooms. During molding, polycarbonate distortions can appear in the plastic that impair or deflect a laser reading light. Despite its shortcomings, a number of manufacturing plants operating today use this process.

Minnesota Mining and Manufacturing Company (3M), for example, uses a prior art photo-polymerization (2P) process in which precut polycarbonate precursor resin is inserted between a master and a base plate, and then embossed. This polycarbonate precursor sandwich filling is then cured with ultraviolet light. This replication method has the advantage of being quick, which comes partially by avoiding any heating/cooling of the plastic during production. Critics of the 2P process say yields remain low because improper curing or warpage causes many discs to be rejected.

DOCData of Venlo, The Netherlands, and COMDisc of Los Angeles use two quite different methods that attempt to produce fast, low-cost replication of compact discs by a continuous printing or embossing technique. Both systems have worked in a laboratory setting, but neither is currently available commercially. Although the techniques show promise and have attracted a great deal of attention, no major company has yet committed itself financially to either process.

Masters are original copies of data recordings that are produced from tapes or software provided by artists and programmers. Lasers and electron beams (E-beams) are used as exposure tools for a photoresist carried on glass and photoplates. Semiconductor photomasks are similarly prepared.

Stampers are sub-masters duplicated from masters. Electroplating and photopolymers are two common ways that gaps in resist images are filled to produce reverse-tone sub-master duplicates of the masters so that the ultimate copies manufactured are positives of the masters.

The prior art photo-polymerization (2P) process starts with monomers that are irradiated to form polymers. In data recording disk duplication, such a process requires expensive machinery for ultraviolet irradiation mid pressurizing the monomer solutions.

SUMMARY OF THE PRESENT INVENTION

It is therefore an object of the present invention to provide a method of duplicating data recordings.

It is a further object of the present invention to provide a duplicated data recording that faithfully duplicates shallow features from a master recording, e.g., as shallow as 800 angstroms.

Briefly, an embodiment of the present invention is a process in which a solution, such as fluoropolymer, is spin coated onto a master disk, such as glass substrate with photoresist images, before separating. After drying and film forming, a polymer membrane results which is a faithful reproduction of micron-sized optical recording features on the surface of the master. Such membrane is either peeled-off and mounted to a pellicle-like frame or first laminated to a stiffer, stronger substrate before peeling to support the duplicate.

An advantage of the present invention is that it provides a process that reproduces images from a master with such extremely high resolution, e.g., 0.1 micron, and with such high fidelity, that high capacity data storage media can be made.

Another advantage of the present invention is that it provides a process that requires no highly-specialized equipment, other than a simple spinner, to produce duplicates of optical data recording disks and semiconductor masks.

An advantage of the present invention is that it provides a duplication process that does not require heating, high pressure or high vacuum, to produce faithful duplicates of master data recordings.

A further advantage of the present invention is that it provides a manufacturing process for data recording duplicating that uses natural solvent drying and conformal mapping to accomplish what would otherwise require heating.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
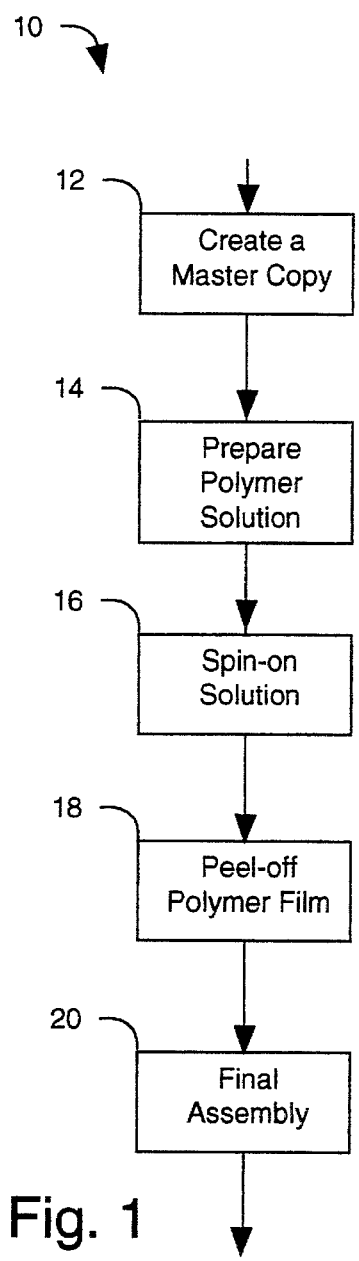
FIG. 1 is a flowchart of a process embodiment of the present invention.

Processes of the present invention include the traditional making of a mask with electron, optical or ion beam writing on conventional chrome-on-glass photoplates. FIG. 1 illustrates a process 10 that begins with a step for making a master copy. The master copy, such as photoplates, are then etched in a step 12 to remove chrome to produce relief features that are as shallow as 800–1000 angstroms (0.08–0.1 micron). In a step 14, a polymer solution is then prepared, such as from nitrocellulose, polyvinyl, polyester or polymethylmethacrylate, in a suitable solvent to dissolve polymer. The polymer solution is then spun-on in a step 16 to a mask or similar master with relief features. A suitable spinner is used that can vary in speed from several hundred revolutions per minute (RPM) to several thousand RPM. Such a spinner preferably has vents to promote film drying while spinning. A thin film several microns thick will be formed under suitable conditions and it will mimic the features in the surface of the master copy. The film is then separated, or peeled-off in a step 18, from the master, either alone or after laminating it to another, stronger substrate to reinforce it before being separated from the master copy.

The resulting film is generally of high quality and can be processed to enhance its performance as an optical device by altering the optical properties. Such techniques include antireflective (AR) coatings. Additional optical features can be added, or those already included can be subtracted, by micro-etching or laser techniques.

In FIG. 1, a final assembly step 20 comprises either making a free-standing copy that has an aluminum ring over which the film is stretched taut to eliminate distortions. Alternatively, an optically-benign hard disk is laminated on prior to separation of the film, such as in step 18. An ultraviolet-curable adhesive is preferably used to attach the film to the aluminum frame. Pellicle making processes and techniques are useful in connection with the present invention. The present inventor, Gilbert Hong, has described such making of pellicles in United States Patent application Ser. No. 07/936,758, filed Aug. 27, 1992, and titled PHOTOCHEMICALLY STABLE DEEP ULTRAVIOLET PELLICLES FOR EXCIMER LASERS, which application is incorporated hereinby reference as if fully set forth.

Process 10 may be applied in widely ranging areas of manufacture, e.g., optical storage, biomedical, semiconductor manufacturing and micro-machining. In CD-ROM manufacturing, process 10 can be used where the so-called "2P" process is used, such as in the making of plastic stampers (sub-masters) and/or the final products (sub-submasters). A release agent may be desirable in certain situations to promote the step of peeling-off the film. In pellicle manufacturing, fluoropolymer and silicone based materials are widely used as release agents. For stampers made of fluoropolymer, a copy of the stamper made of any traditional plastic material would separate well from the stampers because of the relatively small surface energy of non-sticking fluoropolymer.

In semiconductor fabrication mask making, a photoplate is used as a basis for image or pattern generation. Photoplates are typically very flat pieces of glass, e.g., synthetic quartz, with a thin film for sputtered chrome. Photosensitive resist is applied to the chrome. A laser beam, for example, is used to expose the photoresist. Depending on whether the photoresist is positive or negative type, one of the exposed or non-exposed areas of photoresist will wash away in a bath to reveal the chrome which is then susceptible to chemical etching. Therefore, photographic images can be impressed in the photoresist to be mimicked by patterns in the chrome film. Permanent images are then retained in the chrome on glass.

Phase shift masks can replace chrome masks. For microlithographic applications, phase shift masks do not necessarily rely on light intensity variations, but rather rely on phase variations for image reconstruction. Masks made without chrome can be produced with the present invention, since polymer films of any desired thickness can be accommodated.

The present invention includes processes which accept such chrome images as masters and to then make phase shift masks by spin coating of the chrome mask.

Many materials useful in the manufacturing of pellicles are useful as phase shift masks. For example, nitrocellulose, which has a reflective index of 1.51, can be used with a solvent of PM acetate. Polyvinyl butyral, which has a reflective index of 1.48, can be used with a solvent of EE acetate. Cellulose acetate, which has a reflective index of 1.49, can be used with a solvent of EM acetate. Fluoropolymer, which has a reflective index of 1.32, can be used with a solvent of FC-40 and FREON. Such solutions are preferably filtered to remove any particulates. A 0.2 micron filter is useful, such as marketed by Millipore, Pall Filter and Cuno, and are commercially-and universally available.

Figure 2:
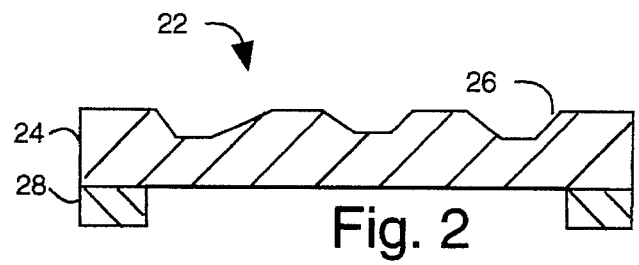
FIG. 2 is a cross-section of an all-polymeric film phase shift mask embodiment of the present invention.

FIG. 2 shows a phase shift assembly 22 comprised of simple polymeric film 24 with integrated circuit design features 26 attached to an aluminum frame 28, similar to a conventional pellicle. The frame 28 makes film 24 optically flat by holding it taut. Phase shifting is accomplished by passing light perpendicular to the film 24. Images in the film 24 are represented by differs in film thickness, and these images can be transferred to a semiconductor wafer. As a consequence, a phase shift mask for semiconductor processing can be made entirely of polymer films. The present invention represents a substantial simplification for what had otherwise been near impossible to achieve in the prior art.

Mass production which allows final unit-level customization is also possible with the present invention. Pellicles with images can be made as copies from traditional masks or as potential copies of a master CD-ROM for mass storage of information, e.g., computer data, x-ray images, audio/video data, etc. Pellicles with images can also be made from another type of master. A simple piece of quartz with etched images corresponding to digital ones and zeroes. A polymer solution spin-coated on a master results in a copy which conformably maps the geometry of the master.

An original, chromeless mask can be manufactured according to the present invention with prior art mask making techniques. But instead of using chrome blanks, glass blanks with photoresist are used. The photoresist is exposed with a laser or electron beam. The images are photo-developed. The resultant patterned resist image is then used as a mask to etch the glass substrate, either by plasma etching or by liquid phase etching with hydrofluoric acid. A mask with only etched glass can also be made in a single step with ion beam etching or plasma enhanced chemical deposition without using photoresist. At present, photolithographic processes are quite advanced and are preferred.

A direct writing of data on disks made of nitrocellulose membrane is possible because such material can be directly ablated by intense ultraviolet light (EXCIMER laser, etc.) or ion beam. The nitrocellulose membrane can then be used as a master on a spinner for forming a spun-on polymer copy, or as a template which allows post-customization, such as the filling-in of blanks with information.

Substrates for information storage blanks can be from standard pellicles supported by aluminum frames. These blanks may be written by direct writing with a laser or ion beam, or by adding another photochemical sensitive agent (PSA) on top of the pellicle for photo-imaging. These two methods result in slightly different kinds of originals. One forms a single layer structure and the second forms a double layered structure. A free-standing film copy can be made which is several microns thick that has good strength. Multiple coatings are possible, wherein a second coating can be used to deposit polymers of a type different from the first with proper adhesion. Suitable solvents are required that will dissolve the added polymer without attacking the base polymer during spinning-on and drying. In order to delineate patterns, at least one layer in a multi-layer structure should be sensitive enough to be written on via a focused ultraviolet light, electron beam or ion beam.

The present invention includes processes to mass-produced templates which can then be individually customized later with direct write instruments. For example, such applications as making credit cards, optical memory cards and health insurance cards would be benefited. In two-layered structures of the present invention, a first layer may be mass-produced with a single pattern, and the second layer may be customized later for personalization to a particular user, e.g., serialized.

In the manufacturing of CD-ROMs, aluminum coating are used to enhance the CD's reflectivity. The optical qualities of CD-ROM copies can be improved with conventional technologies used to improve the performance of pellicles. Antireflective coatings, when applied, can increase the transmitted light intensity if reflective glare is a problem. Single layer antireflective coating involves a material that has a reflective index of $n_3$ where $n_3\sqrt{n_1}$ and $n_1$ is the reflective index of the base material. For nitrocellulose, $n_1=1.50$, so $n_3=1.23$. Since materials with such low indices of reflection are difficult to find, fluoropolymers which have indices around 1.3 are frequently used. The result is a three-layer structure.

There are at least three fluoropolymers simply referred to as "AM", "AD" and "AS" that all have similar properties and that are suitable for antireflective coatings of various films. "AM" is available from 3M Company and can be used for nitrocellulose, polyvinyl butyral and cellulose acetate. "AD" is available from DuPont as AF-1600 and can be used for nitrocellulose and cellulose acetate. "AS" is available from Asahi Chemical as CITOP, and can be used for polyvinyl butyral. "AD" has the lowest reflective index and therefore the best antireflective properties.

Two antireflective coatings may be used in combination, one with a higher reflective index and the other with a lower reflective index. The resulting relationship is such that $n_2/n_3=\sqrt{n_1}$, where $n_1$ is the base material, $n_3$ is the outermost material and $n_2$ is the intermediate material. In this case, $n_3$ preferably has the lower reflective index material, with $n_2$ being the higher reflective index material and $n_1$ having an intermediate index. Preferred high reflective index materials include polystyrene, poly-sulfone in chlorobenzene and have typical reflective indices of 1.7. Preferred low reflective index materials include "AM", "AS" and "AD", or 3M Company's FC-40 and used as solvents and have typical reflective indices of 1.3.

Figure 3:
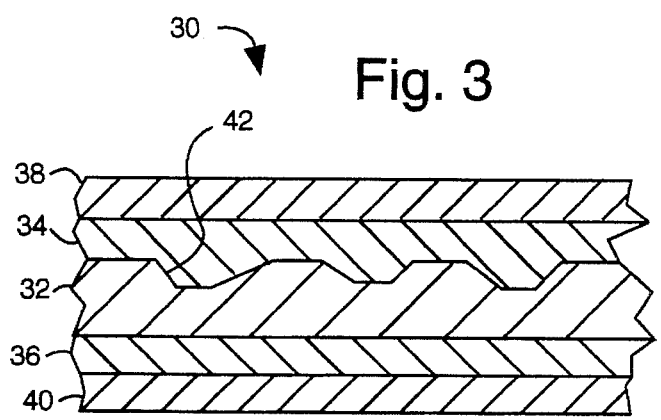
FIG. 3 is a cross-section of a pellicle with two antireflective coatings applied according to the present invention.

FIG. 3 illustrates a five-layer structure 30 in cross-section. A substrate 32 has a reflective index of 1.50. A first pair of antireflective coatings 34 and 36 have a reflective index of 1.70. A second pair of antireflective coatings 38 and 40 have a reflective index of 1.32. An optical feature 42 is shown in one of the surfaces of substrate 32 to represent encoded digital data.

Fluorescent dyes can be incorporated into nitrocellulose or any other base material, such as second coatings that are applied like antireflective coatings. For example, in FIG. 3 if coating 34 were comprised of fluorescent dye, then the optical feature 42 would create variations in the fluorescent intensities. Such variations can be optically read as digital ones and zeroes. Different dyes may be added to different layers for increased contrast levels. For example, substrate 32 can be dyed red and coating 34 can be dyed green. Dyes such as coumarins are preferred, since they can absorb ultraviolet light and emit visible light. With proper filtration, the incident beam of light can be made to not interfere with the emitted (fluorescent) beam. In pellicle based read only memories (ROMs), the resultant signal-to-noise ratio is an improvement over the prior art.

Microcuvettes are used in the pharmaceutical industry for drug formulation and testing. Large scale investigation of very minute samples is common in the industry. The present invention may be used to mass-produce microcuvettes of various forms and shapes in one disk. Microcuvette assembly is useful in DNA analysis, microanalysis and biological assay. Such techniques allow relatively inexpensive simultaneous testing of large test quantities. Such tests are typically conducted in clean-room environments to control contamination. Rows and columns of microcuvettes connected with channels or as isolated potholes may be fabricated with the processes of the present invention. Concentration gradients can be established along rows or columns, or both, simply by filling cuvettes according to certain automatic schemes. The concentration is varied as a function of time, and samples are allowed to flow from one cuvette to another sequentially, via channels. Drugs of various compositional formulations can be tested to obtain optimal effectiveness. Automatic analysis with robotic and computer vision can be constructed as a fully-automated drug testing machine. Microanalysis is required in DNA analysis, because billions of pieces of information must be deciphered. The present invention is thus uniquely suited to become incorporated in certain robotic analysis of DNA and other biochemical assay.

Figure 4C:
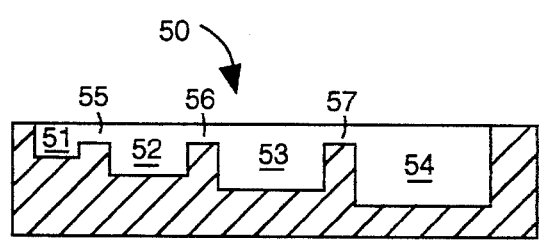
FIG. 4C is a cross-sectional diagram of the microcuvettes of FIGS. 3A and 3B.
Figure 4A:
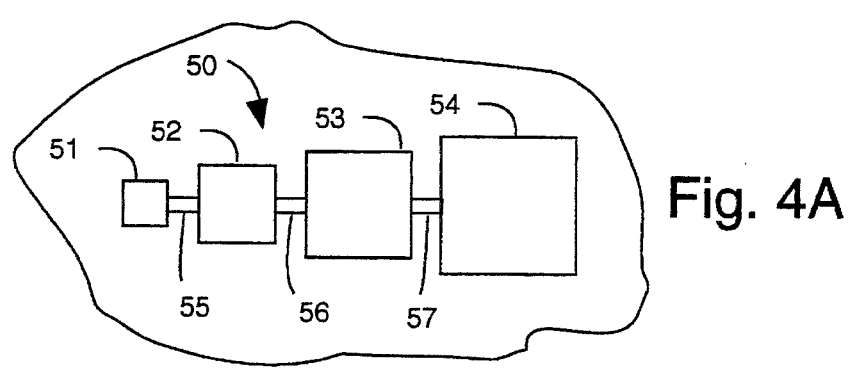
FIG. 4A is a plan view of a microcuvette embodiment of the present invention with square-shaped cuvettes.
Figure 4B:
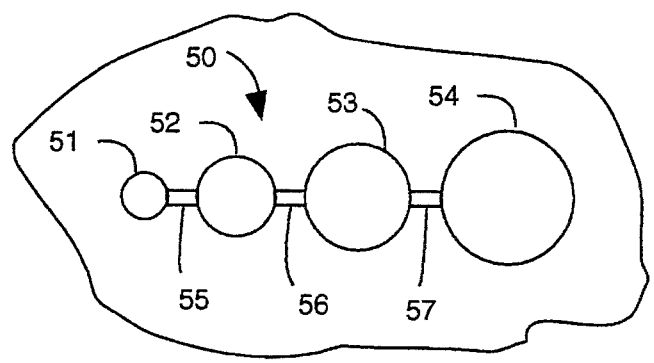
FIG. 4B is a plan view of a microcuvette embodiment of the present invention with circular-shaped cuvettes.

FIGS. 3A through 3C illustrate a microcuvette 50 with a set of four cuvettes 51–54 interconnected with a set of three channels 55–57. In FIG. 4A, cuvettes 51–54 are square in plan view. In FIG. 4B, cuvettes 51–54 are circularly shaped in plan view. FIG. 4C illustrates cuvettes 51–54 in cross-section to show a gradient arrangement.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A method of manufacturing optical data storage disks from a master recording disk that has physical surface features which represent data, comprising the steps of:

creating a first plurality of physical surface features that correspond to data onto a surface of a master recording disk;

preparing a liquid solution of polymers;

spinning-on said solution onto said master recording disk while rotating;

drying said solution on said master recording disk; and peeling-off a polymer film formed from a drying of said solution on said master recording disk, wherein said peeled-off film has a second plurality of physical surface features duplicating said data embodied in said surface of the master recording disk.

2. The process of claim 1, wherein:

the stem of preparing of said liquid polymer solution includes using at least one of nitrocellulose, polyvinyl, polyester or polymethylmethacrylate, fluoropolymers and silicone products in a suitable polymer solvent.

3. The process of claim 1, wherein:

the step of spinning-on of said liquid polymer solution includes the use of a spinner rotating in the range of several hundred revolutions per minute (RPM) to several thousand RPM.

4. The process of claim 1, wherein:

the step of peeling-off of said polymer film is preceded by a lamination of a substrate to said dried polymer film to support it during and after the step of peeling-off.

5. The process of claim 1, wherein:

the step of peeling-off of said polymer film is succeeded by a mounting of said dried and peeled-off polymer film to a ring frame for support and elimination of film distortions.

6. A method of manufacturing phase shift masks from a mask that has physical surface features which represent an integrated circuit design, comprising the steps of:

creating a first plurality of physical surface features that correspond to an integrated circuit design pattern on a surface of a master mask:

preparing a liquid solution of polymers; spinning-on said solution onto master mask while rotating;

drying said solution on said mask; and peeling-off a polymer film formed from a drying of said solution on said master mask, wherein said peeled-off film has physical surface features duplicating said integrated circuit design pattern.

7. An optical-performance enhancement method for manufacturing an all-polymeric phase shift mask having one or more featured layers of polymeric material made by a process comprising the steps of:

creating a first plurality of physical surface features that correspond to a pattern on a surface of a master mask;

preparing a liquid solution of polymers;

spinning-on said solution onto said master mask while rotating;

drying said solution on said master mask; and peeling-off a polymer film formed from a drying of said solution on said master mask.

8. The method of claim 7, comprising the further step of:

applying an antireflective coating to said polymer film providing for an optical performance enhancement of said polymer film.

9. A method for duplicating micro-structures from a master that has surface features which represent such micro-structures, comprising the steps of:

creating a first plurality of physical surface features that correspond to a pattern on a surface of a planar microstructure master;

preparing a liquid solution of polymers;

spinning-on said solution onto said planar micro-structure master while rotating;

drying said solution on said master; and peeling-off a polymer film formed from a drying of said solution on said master, wherein said peeled-off film has physical surface features duplicating said micro-structures embodied in said surface of said master.

10. The process of claim 9, further comprising the preliminary step of:

imaging a microcuvette on said master, wherein a system of cuvettes are ultimately duplicated in said peeled-off polymer film.

* * * * *